United States Patent
Liao et al.

(10) Patent No.: US 8,884,717 B2
(45) Date of Patent: Nov. 11, 2014

(54) DIPLEXER

(71) Applicants: Yu-Lin Liao, Hsinchu (TW); Ian-Chun Cheng, Miaoli County (TW)

(72) Inventors: Yu-Lin Liao, Hsinchu (TW); Ian-Chun Cheng, Miaoli County (TW)

(73) Assignee: Cyntec Co., Ltd., Hsinchu (TW)

( * ) Notice: Subject to any disclaimer, the term of this patent is extended or adjusted under 35 U.S.C. 154(b) by 13 days.

(21) Appl. No.: 13/741,398

(22) Filed: Jan. 15, 2013

(65) Prior Publication Data

US 2013/0271239 A1 Oct. 17, 2013

Related U.S. Application Data

(63) Continuation-in-part of application No. 13/570,267, filed on Aug. 9, 2012.

(60) Provisional application No. 61/623,566, filed on Apr. 13, 2012.

(51) Int. Cl.
| | |
|---|---|
| *H01P 5/12* | (2006.01) |
| *H03H 7/46* | (2006.01) |
| *H03H 7/01* | (2006.01) |
| *H03H 1/00* | (2006.01) |

(52) U.S. Cl.
CPC .............. *H03H 7/01* (2013.01); *H03H 7/463* (2013.01); *H03H 2001/0092* (2013.01)
USPC ............................ 333/134; 333/126; 333/128

(58) Field of Classification Search
USPC .................................. 333/126–129, 132, 134
See application file for complete search history.

(56) References Cited

U.S. PATENT DOCUMENTS

| | | | | |
|---|---|---|---|---|
| 5,340,947 | A * | 8/1994 | Credle et al. | 174/262 |
| 6,414,567 | B2 * | 7/2002 | Matsumura et al. | 333/134 |
| 7,404,250 | B2 * | 7/2008 | Cheng et al. | 29/852 |
| 7,812,702 | B2 * | 10/2010 | Mano et al. | 336/200 |
| 2009/0295501 | A1 * | 12/2009 | Hayashi et al. | 333/132 |

* cited by examiner

*Primary Examiner* — Robert Pascal
*Assistant Examiner* — Kimberly Glenn
(74) *Attorney, Agent, or Firm* — Min-Lee Teng; Litron Patent & Trademark Office

(57) ABSTRACT

The invention discloses a diplexer formed from the combination of a first filter and a second filter, wherein both the first filter and the second filter have at least one through-hole via inductor. The diplexer has an input terminal to receive an input signal. The first filter has a first terminal electrically connected to the input terminal and a second terminal to generate a first output signal; the second filter has a third terminal electrically connected to the input terminal and a fourth terminal to generate a second output signal. The diplexer has a first output terminal electrically connected to the second terminal of the first filter to output the first output signal and a second output terminal electrically connected to the fourth terminal of the second filter to output the second output signal.

20 Claims, 17 Drawing Sheets

US 8,884,717 B2

DIPLEXER

CROSS REFERENCE TO RELATED APPLICATIONS

This application is a continuation-in-part of U.S. patent application Ser. No. 13/570,267, filed Aug. 9, 2012, and titled "A Through-Hole Via Inductor in a High-Frequency Device," which claims the benefit of priority of U.S. Provisional Patent Application No. 61/623,566, filed Apr. 13, 2012, and titled "A Through-Hole Via Inductor in a High-Frequency Device". All of these applications are incorporated by referenced herein in their entirety.

BACKGROUND OF THE INVENTION

I. Field of the Invention

The present invention relates to a diplexer and, in particular, to a diplexer formed from the combination of a first filter and a second filter, wherein each of the first filter and the second filter has at least one through-hole via inductor.

II. Description of the Prior Art

Recently, the portable electronic and mobile communication products have gradually become lighter, thinner, smaller-sized, more multi-functional, more reliable and cheaper. There is a tendency to develop high-density devices. The active and passive devices have become smaller-sized, integrated, on-chip and in-module to reduce the costs and improve the competitiveness of the devices.

There are some technologies, such as MLCC (multi-layer ceramic capacitor), via-drilling and via-filling of a single-layer substrate or lithography process, to shrink the size of a device by maximizing the usage of the space within the device. Conventionally, please refer to FIG. 1, via-drilling and via-filling 2 can be performed in a single-layer ceramic substrate 1. Then, multiple single-layer ceramic substrates 1 can be combined into a multi-layer substrate 3 (by sintering) to form a through-hole via 4 in a multi-layer ceramic substrate. A through-hole via 4 is used to electrically connect two adjacent conductive layers. The above-mentioned through-hole via is only used for an electrical connection between different layers, and the space of the through-hole via will require a larger substrate for accommodating it. Therefore, what is needed is a solution to fully utilize the space of a through-hole via to further shrink the size of a device and to achieve better electrical performance of the device.

SUMMARY OF THE INVENTION

One objective of the present invention discloses a diplexer formed from a combination of a first filter and a second filter, wherein each of the first filter and the second filter has at least one through-hole via inductor. The diplexer has an input terminal to receive an input signal. The first filter has a first terminal electrically connected to the input terminal and a second terminal to generate a first output signal; the second filter has a third terminal electrically connected to the input terminal and a fourth terminal to generate a second output signal. The diplexer has a first output terminal electrically connected to the second terminal of the first filter to output the first output signal and a second output terminal electrically connected to the fourth terminal of the second filter to output the second output signal. In one embodiment, each of the first filter and the second filter can comprise at least one U-shape through-hole via inductor.

The present invention regards the conductive material in the first through-hole via and the second through-hole via in the substrate as a main inductor (named through-hole via inductor hereafter). That is, the inductance of the through-hole via inductor is greater than that of the horizontal inductor on the substrate. In one embodiment, a parasitic capacitance in the interior of the diplexer can be used as a main capacitor so that the process cost is reduced. It can not only greatly shrink the size of the device but also improve electrical performance.

In one embodiment, the first filter can be a high-pass filter and the second filter can be low-pass filter. Preferably, the cut-in frequency of the first filter is substantially 4 GHz and the cut-off frequency of the second filter is substantially 3 GHz. In one embodiment, the input signal comprises a first frequency and a second frequency smaller than the first frequency; the first output signal comprises a first frequency, and the second output signal comprises a second frequency. Preferably, the first frequency is substantially 5.0 GHz and the second frequency is substantially 2.4 GHz.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as following. The described preferred embodiments are presented for purposes of illustrations and description and they are not intended to limit the scope of the present invention.

The invention discloses that a conductive material in a through-hole via is used as an inductor (maybe called vertical inductor) for some high-frequency devices, such as a high-frequency filter. A through-hole via is used to electrically connect two adjacent conductive layers between which there is an insulating layer. In the process, the patterned conductive layer on the substrate and a through-hole in the substrate is made of the conductive material, wherein a through-hole via is filled with a small portion of the conductive material. Compared with the inductor made of a patterned conductive layer on the substrate, the inductor which is made of a small portion of the conductive material in the through-hole can be often ignored. In the present invention, it regards the conductive material in the through-hole in the substrate as a main inductor (named a through-hole via inductor hereafter), which can be often used in some high-frequency devices, such as a high-frequency filter. In a high-frequency operational environment (operated at not less than 1 GHz, preferably substantially at 2.4 GHz), the inductance of the conductive material in the through-hole will play an important role. For example, it can have a better Q value. The inductance of the through-hole via inductor can be computed by the simulation software to determine better electrical performance. Therefore, it can make conductive wires in circuit shorter, make the size of high-frequency device smaller and make electrical performance better.

Two terminals of the through-hole via inductor can be electrically connected to any other conductive element. In one example, one terminal can be electrically connected to a capacitor and the other terminal can be electrically connected to an inductor. In another example, one terminal can be electrically connected to a capacitor and the other terminal can be electrically connected to ground.

Figure 1:
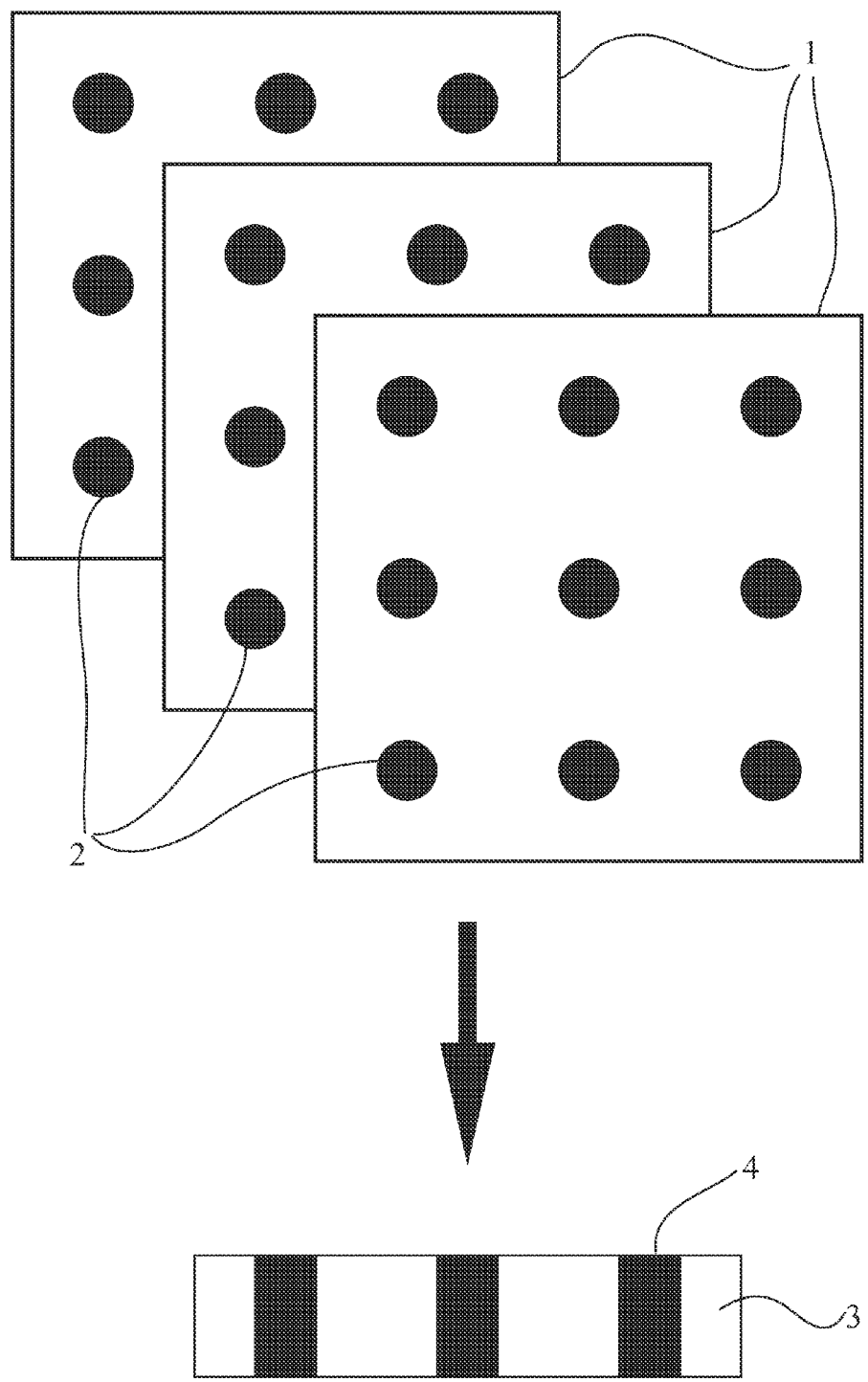
FIG. 1 illustrates a through-hole via in multi-layer substrate (by sintering).
Figure 2A:
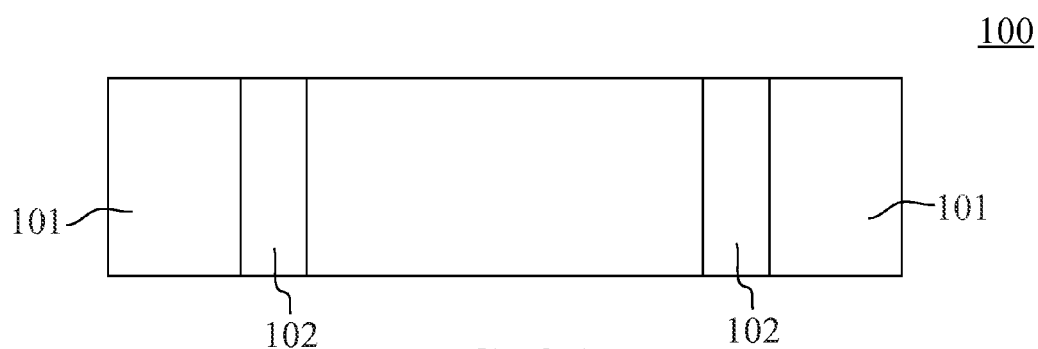
FIG. 2A illustrates a schematic cross-sectional view of the structure of the through-hole via inductor.
Figure 2B:
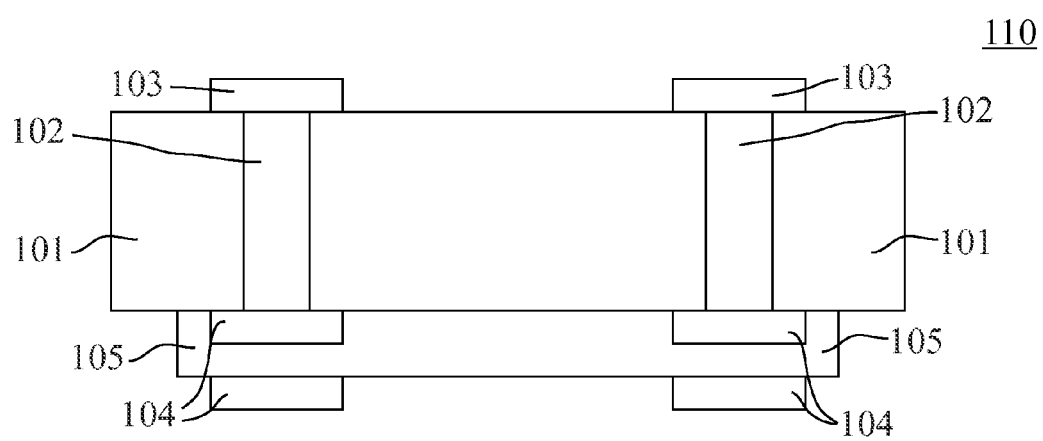
FIG. 2B illustrates a schematic cross-sectional view of the preferred structure made of a through-hole via inductor and a capacitor.

FIG. 2A illustrates a schematic cross-sectional view of the structure 100 of the through-hole via inductor. The structure 100 includes a substrate 101, a through-hole via inductor 102. FIG. 2B illustrates a schematic cross-sectional view of the preferred structure 110 made of a through-hole via inductor and a capacitor. The structure 110 includes a substrate 101, a through-hole via inductor 102, a horizontal inductor 103, a horizontal capacitor 104 and a dielectric layer 105. In the structure 100, 110, the inductance of the through-hole via inductor 102 plays an importance role (more critical than any other horizontal inductor 103) in high-frequency operational environment so that the structure 100, 110 can be applied to some high-frequency devices, such as a high-frequency filter. In one embodiment, the inductance of the through-hole via inductor 102 is greater than that of that horizontal inductor 103. In one embodiment, the resultant inductance of the through-hole via inductor 102 and the horizontal inductor 103 is substantially equal to the inductance of the through-hole via inductor 102. In one embodiment, the through-hole via inductor 102 includes at least two materials which are well designed in the through-hole via inductor 102 to achieve the above electrical characteristics, wherein one of said at least two materials is a conductive material. In one embodiment, the through-hole via inductor 102 has an integral body. The substrate 101 can be made of any suitable material, such as a dielectric substrate or a ceramic substrate (e.g., aluminum-oxide ($Al_2O_3$) substrate). The through-hole via inductor 102 can be made of any suitable material, such as Cu, Ag or a combination thereof. Preferably, the height of the through-hole via inductor 102 is about 320 μm and the width in diameter of the through-hole via inductor 102 is about 100 μm.

Figure 2C:
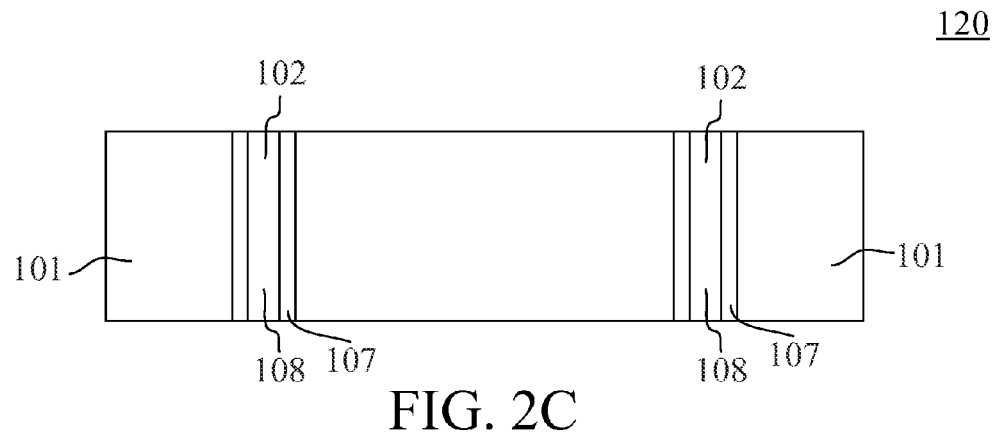
FIG. 2C and FIG. 2D illustrates a schematic cross-sectional view of the structure of the through-hole via inductor made of at least two conductive materials.
Figure 2D:
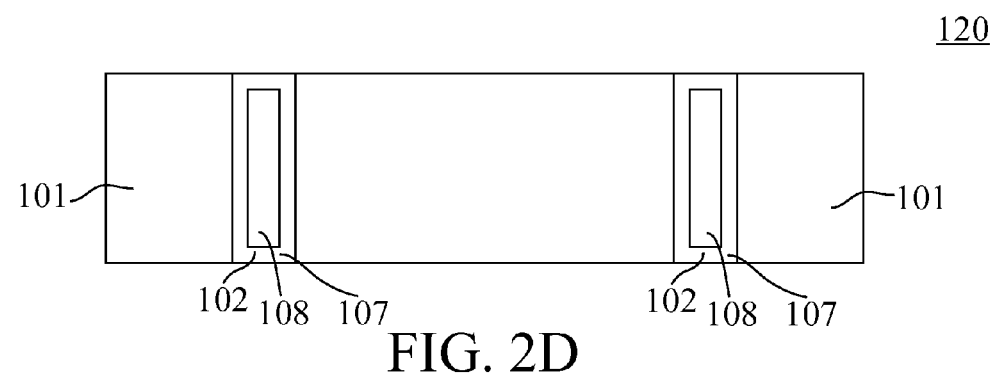

In one embodiment (structure 120), the through-hole via inductor 102 can be made of at least two conductive materials. Please refer to FIG. 2C and FIG. 2D, the through-hole via inductor 102 can be made of a first conductive material 107 overlaying the sidewall of the through-hole and a second conductive material 108 enclosed by the first conductive material 107. The first conductive material 107 can overlay the sidewall of the through-hole by electroplating or any suitable coating process. Preferably, the first conductive material 107 can be made of Cu and the second conductive material 108 can be made of Ag.

Figure 2E:
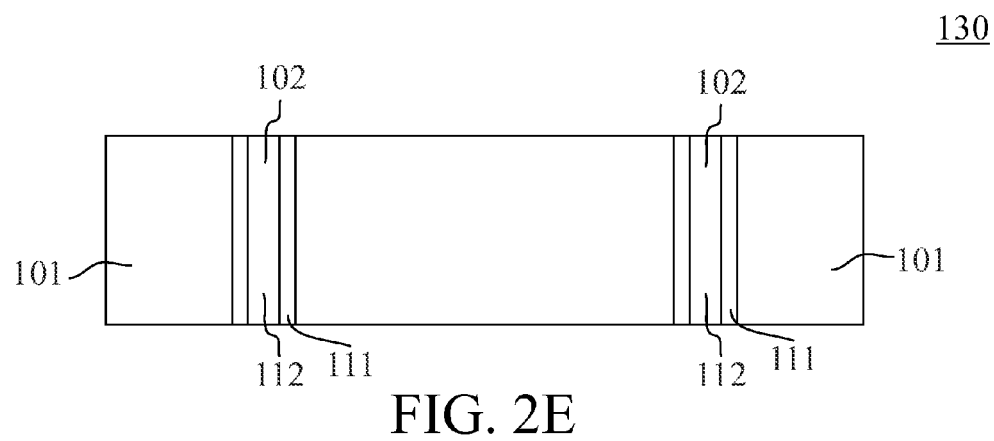
FIG. 2E and FIG. 2F illustrates a schematic cross-sectional view of the structure of the through-hole via inductor which comprises a conductive material and a non-conductive material.
Figure 2F:
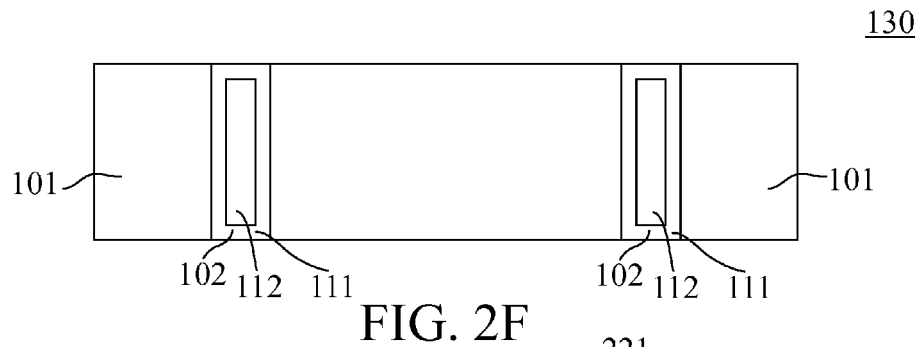

In another embodiment (structure 130), the through-hole via inductor 102 can comprise a conductive material 111 and a non-conductive material 112 enclosed by the conductive material 111 (refer to FIG. 2E and FIG. 2F).

The invention also discloses a U-shape through-hole via inductor made of a first through-hole via inductor in the substrate, a second through-hole via inductor in the substrate and a horizontal inductor on the substrate. One terminal of the horizontal inductor can be electrically connected to the first through-hole via inductor and the other terminal of the horizontal inductor can be electrically connected to the second through-hole via inductor. Please refer to FIG. 3A, the structure 200 includes a substrate 201, a horizontal inductor 221, a first through-hole via inductor 202A and a second through-hole via inductor 202B. FIG. 3B illustrates a three-dimensional perspective view of the U-shape through-hole via inductor 250, wherein the substrate 201 is not shown. The U-shape through-hole via inductor 250 is made of the first through-hole via inductor 202A, the second through-hole via inductor 202B and the horizontal inductor 221. In one embodiment, the first through-hole via inductor 202A has a first integral body and the second through-hole via inductor 202B has a second integral body. The equivalent circuit 220 of the U-shape through-hole via inductor 250 is illustrated in FIG. 3C. In one embodiment of the structure 200, the resultant inductance of the first through-hole via inductor 202A and the second through-hole via inductor 202B is greater than the inductance of that horizontal inductor 221. In one embodiment of the structure 200, the resultant inductance of the first through-hole via inductor 202A, the second through-hole via inductor 202B and the horizontal inductor 221 is substantially equal to the resultant inductance of the first through-hole via inductor 202A and the second through-hole via inductor 202B. The structure 200 can be applied to some high-frequency devices, such as a high-frequency filter. Two terminals 222, 223 of the U-shape through-hole via inductor 250 can be electrically connected to any other conductive element. In one example, one terminal 222 can be electrically connected to a capacitor and the other terminal 223 can be electrically connected to an inductor. In another example, one terminal 222 can be electrically connected to a capacitor and the other terminal 223 can be electrically connected to ground. In yet another example, one terminal 222 can be electrically connected to one terminal of a capacitor and the other terminal 223 can be electrically connected to the other terminal of a capacitor. The way to electrically connect any other conductive element can be well designed, and the design layout can be easily modified by skilled persons in the art so that it can't be described in detail herein. According, it can not only shrink the size of the high-frequency device but also improve the electrical performance of the high-frequency device.

The substrate 201 can be made of any suitable material, such as a dielectric substrate or a ceramic substrate (e.g. aluminum-oxide ($Al_2O_3$) substrate). The first through-hole via inductor 202A and the second through-hole via inductor 202B can be made of any suitable material, such as Cu, Ag or a combination thereof. Preferably, the height of each of the first through-hole via inductor 202A and the second through-hole via inductor 202B is about 320 μm, and the diameter of each of the first through-hole via inductor 202A and the second through-hole via inductor 202B is about 100 μm. The above characteristics described in FIG. 2A to FIG. 2F can be applied to the structure 200 in FIG. 3A.

In the preferred embodiment of the present invention, the structure of the high-frequency device, such as a high-frequency filter, is provided. The structure includes a capacitor and a portion of an inductor disposed on opposite surfaces of the substrate.

Figure 3A:
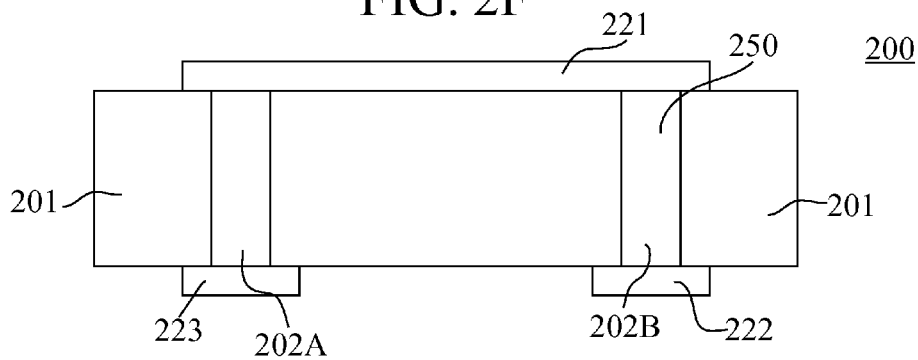
FIG. 3A illustrates a schematic cross-sectional view of the structure of the U-shape through-hole via inductor.
Figure 3B:
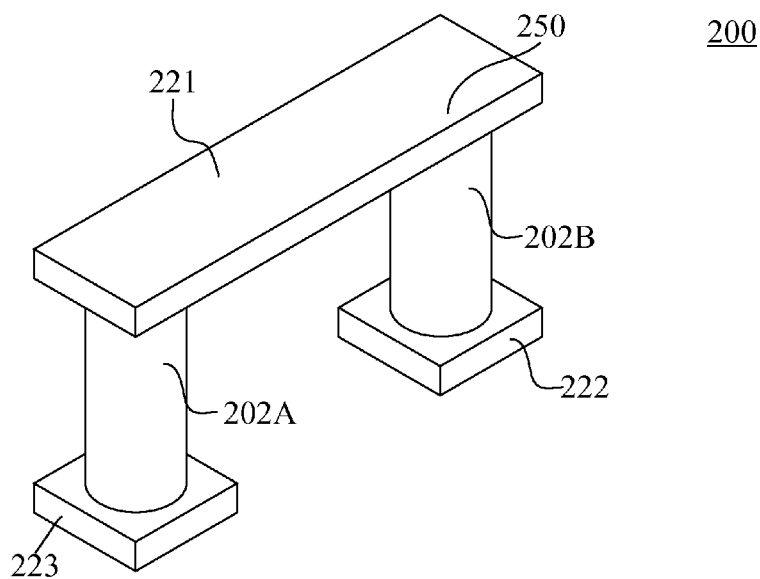
FIG. 3B illustrates a three-dimensional perspective view of the U-shape through-hole via inductor, wherein the substrate is not shown.
Figure 3C:
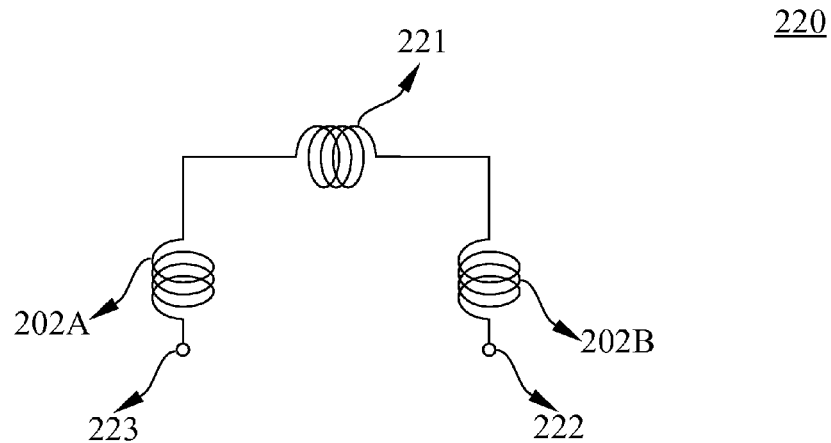
FIG. 3C illustrates an equivalent circuit of the U-shape through-hole via inductor.
Figure 4A:
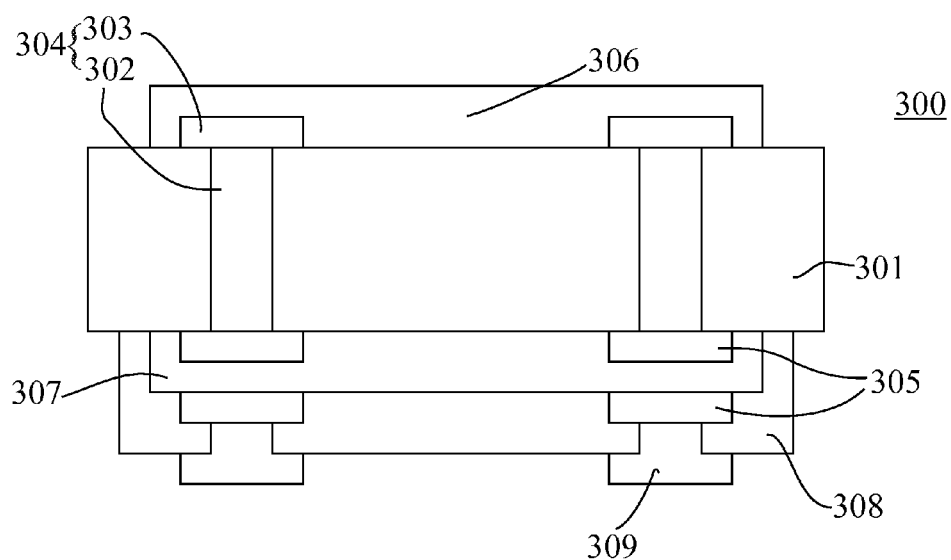
FIG. 4A illustrates a schematic cross-sectional view of the structure of the high-frequency device.

Please refer to FIG. 4A, the structure 300 of the high-frequency device includes a substrate 301, an inductor 304, a capacitor 305, a dielectric layer 307, a first passivation layer 306, a second passivation layer 308 and a contact pad 309. The structure 300 of the high-frequency device mainly includes a capacitor 305 and a portion of an inductor 304 disposed on opposite surfaces of the substrate 301. In particular, the structure 300 of the high-frequency device is mainly made of three parts: a horizontal inductor 303, a through-hole via inductor 302 and a horizontal capacitor (a capacitor) 305, wherein the inductor 304 comprises a horizontal inductor 303 and a through-hole via inductor 302. In one embodiment, the through-hole via inductor 302 has an integral body. In one embodiment, the inductance of the through-hole via inductor 302 is greater than that of that horizontal inductor 303. In one embodiment, the resultant inductance of the through-hole via inductor 302 and the horizontal inductor 303 is substantially equal to the inductance of the through-hole via inductor 302. The above characteristics described in FIG. 2A to FIG. 2F can be also applied to the structure 300 in FIG. 4A. Besides, the U-shape through-hole via inductor 250 previously described in FIG. 3A to FIG. 3C can be also applied to the structure 300 in FIG. 4A.

The substrate 301 can be made of any suitable material, such as a dielectric substrate or a ceramic substrate (e.g. aluminum-oxide ($Al_2O_3$) substrate). The inductor 304 can be made of any suitable material, such as Cu, Ag or a combination thereof. Preferably, the height of the through-hole via inductor 302 is about 320 μm and the width in diameter of the through-hole via inductor 302 is about 100 μm. A dielectric layer 307 is disposed between two electrodes of the horizontal capacitor 305. The first passivation layer 306 overlays a horizontal inductor 303 (a portion of the inductor 304), and the second passivation layer 308 overlays the horizontal capacitor 305. A contact pad 309, which is disposed on the horizontal capacitor 305 and electrically connected to the horizontal capacitor 305, is used as an I/O terminal of the structure 300 of the high-frequency device.

In an preferred embodiment in the present invention, the structure 300 of the high-frequency device has a capacitor 305 and a portion of an inductor 304 disposed on opposite surfaces of the substrate 301, wherein the inductor 304 comprises a plurality of U-shape through-hole via inductors 250 which are all connected to the single capacitor 305 disposed on the bottom surface of the substrate 301. Accordingly, it can improve the electrical performance of the high-frequency device.

Take "two U-shape through-hole via inductors 250 which are all connected to the single capacitor 305 disposed on the bottom surface of the substrate 301" for example. The structure of the high-frequency device comprises: (a) a substrate having a first through-hole, a second through-hole, a third through-hole and a fourth through-hole therein; (b) a first U-shape through-hole via inductor comprising: a first through-hole via inductor, disposed in the first through-hole of the substrate; a second through-hole via inductor, disposed in the second through-hole of the substrate; and a first horizontal inductor disposed on the top surface of the substrate, wherein the first horizontal inductor has a first terminal and a second terminal, wherein the first terminal is electrical connected to the first through-hole via inductor, and the second terminal is electrical connected to the second through-hole via inductor; (c) a second U-shape through-hole via inductor comprising: a third through-hole via inductor, disposed in the third through-hole of the substrate; a fourth through-hole via inductor, disposed in the fourth through-hole of the substrate; and a second horizontal inductor disposed on the top surface of the substrate, wherein the second horizontal inductor has a third terminal and a fourth terminal, wherein the third terminal is electrical connected to the third through-hole via inductor, and the fourth terminal is electrical connected to the fourth through-hole via inductor; (d) a horizontal capacitor on the bottom surface of the substrate, wherein the first through-hole via inductor, the second through-hole via inductor, the third through-hole via inductor and the fourth through-hole via inductor are all electrically connected to the horizontal capacitor. In one embodiment, the first through-hole via inductor has a first integral body, the second through-hole via inductor has a second integral body, the third through-hole via inductor has a third integral body, and the fourth through-hole via inductor has a fourth integral body.

Figure 4B:
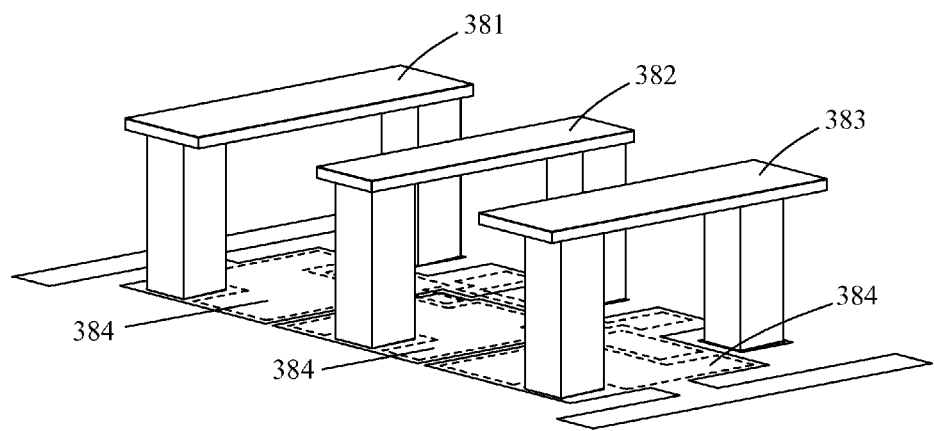
FIG. 4B and FIG. 4C illustrates a three-dimensional perspective view of the structure comprising a first U-shape through-hole via inductor, a second U-shape through-hole via inductor, a third U-shape through-hole via inductor and a pattern layout.
Figure 4C:
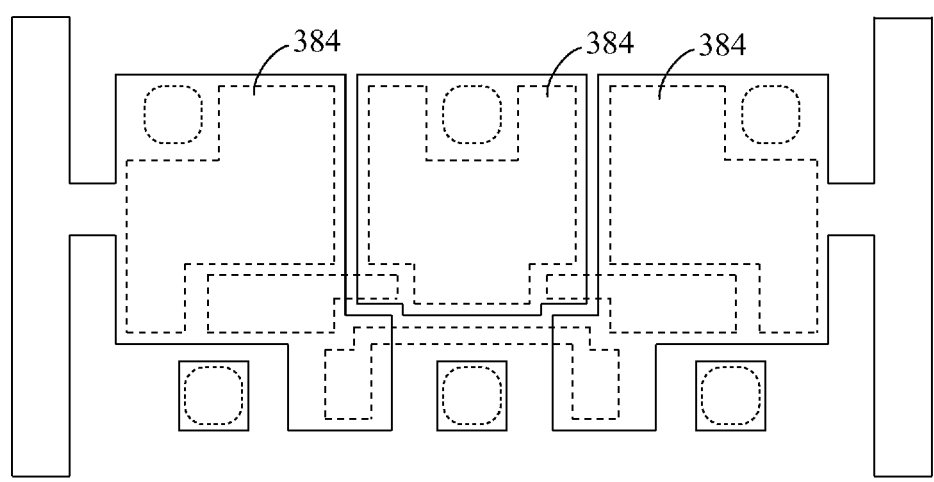

FIG. 4B and FIG. 4C illustrates a three-dimensional perspective view of the structure comprising a first U-shape through-hole via inductor 381, a second U-shape through-hole via inductor 382, a third U-shape through-hole via inductor 383 and a pattern layout 384. The first U-shape through-hole via inductor 381, the second U-shape through-hole via inductor 382, and the third U-shape through-hole via inductor 383 are electrically connected to the pattern layout 384 therebelow. The pattern layout 384 can comprise at least one of an inductor, a capacitor or a ground terminal.

Figure 5A:
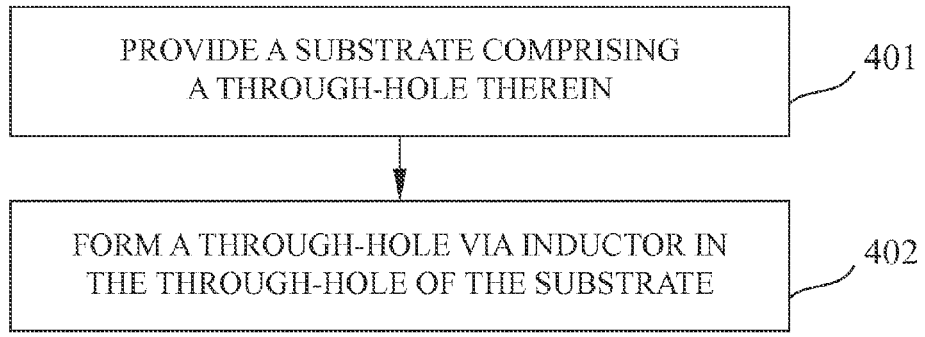
FIG. 5A illustrates the process flow of manufacturing the structure of the through-hole via inductor in FIG. 2A.

FIG. 5A illustrates the process flow of manufacturing the structure 100 of the through-hole via inductor 102 in FIG. 2A. The process flow comprises two main steps: provide a substrate comprising a through-hole therein (step 401); and form a through-hole via inductor in the through-hole of the substrate (step 402).

Figure 5B:
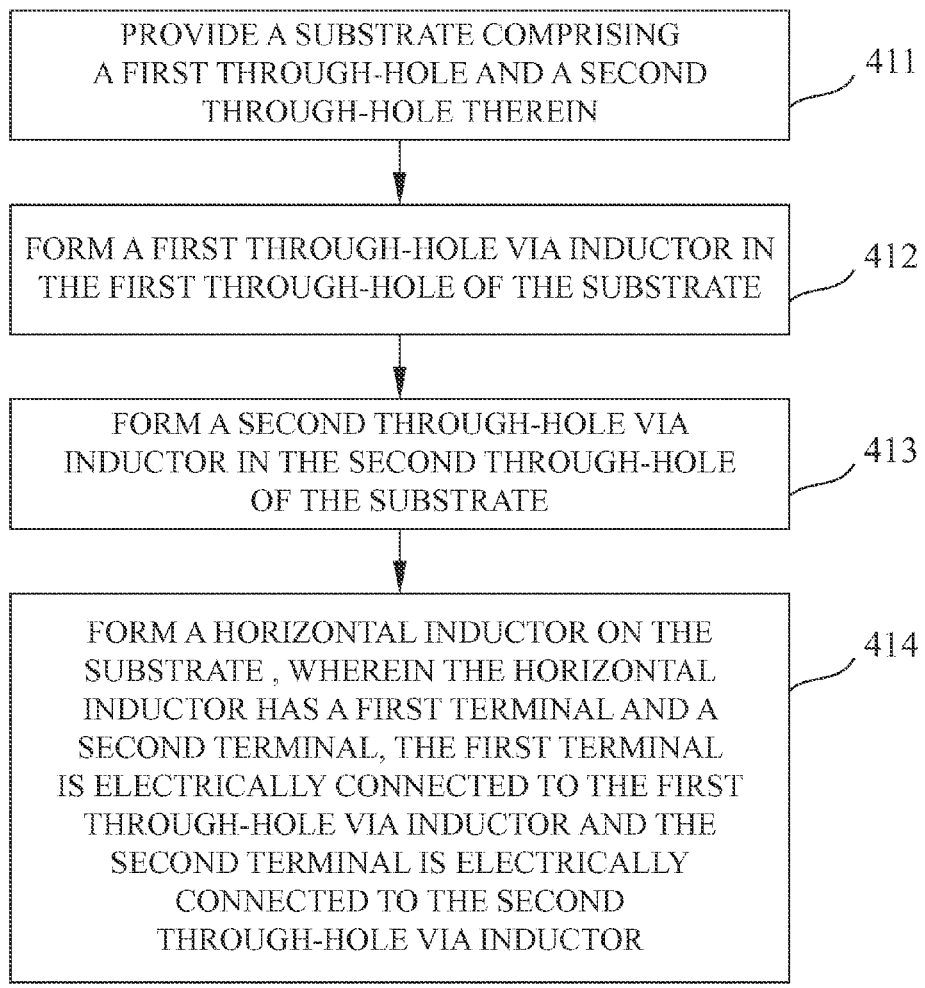
FIG. 5B illustrates the process flow of manufacturing the structure of the U-shape through-hole via inductor in FIG. 3A.

FIG. 5B illustrates the process flow of manufacturing the structure 200 of the U-shape through-hole via inductor in FIG. 3A. The process flow comprises four main steps: provide a substrate comprising a first through-hole and a second through-hole therein (step 411); form a first through-hole via inductor in the first through-hole of the substrate (step 412); form a second through-hole via inductor in the second through-hole of the substrate (step 413); and form a horizontal inductor on the substrate (step 414), wherein the horizontal inductor has a first terminal and a second terminal, the first terminal is electrically connected to the first through-hole via inductor and the second terminal is electrically connected to the second through-hole via inductor.

Figure 5C:
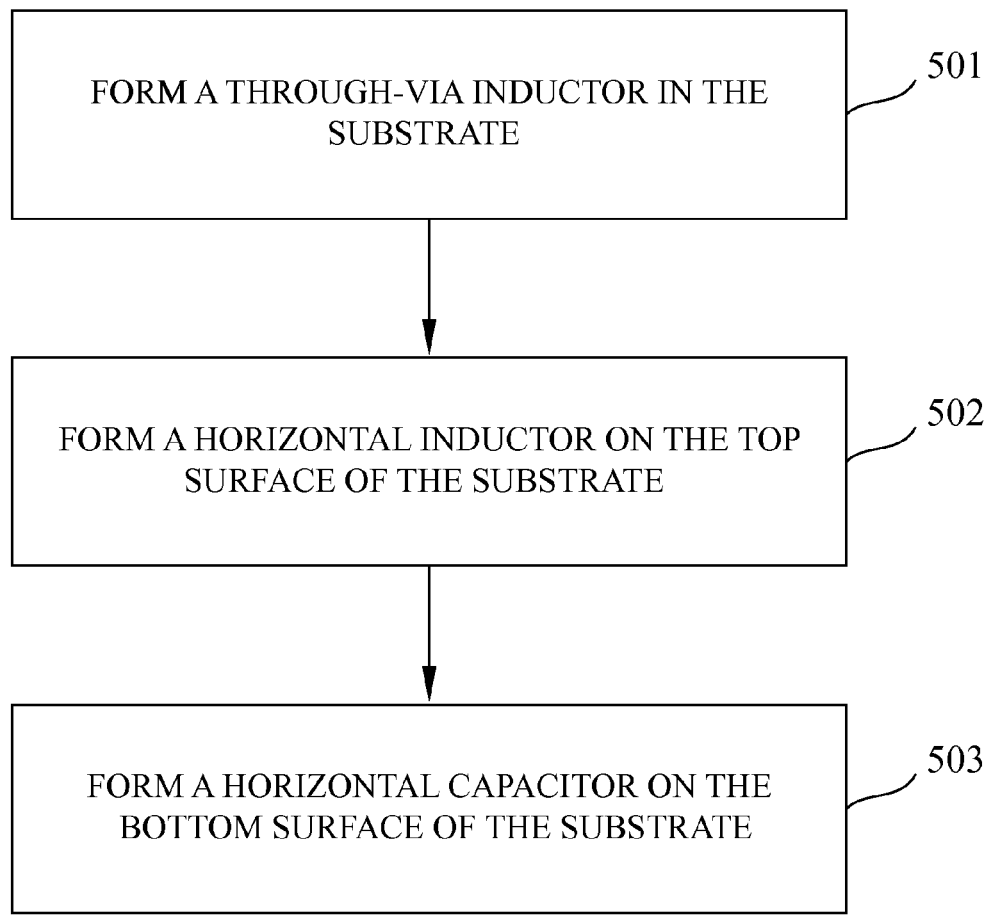
FIG. 5C illustrates the process flow of manufacturing the structure of the high-frequency device in FIG. 4A.

FIG. 5C illustrates the process flow of manufacturing the structure 300 of the high-frequency device in FIG. 4A. The process flow comprises three main steps: form a through-hole via inductor in the substrate (step 501); form a horizontal inductor on the top surface of the substrate (step 502); and form a horizontal capacitor on the bottom surface of the substrate (step 503). The order of step 502 and step 503 can be changed. In one embodiment, the step 501 and step 502 can be combined in a single step "form an inductor 304 in the substrate 301" or "form a U-shape through-hole via inductor 250 in the substrate 301".

Embodiment 1 discloses a method of manufacturing the structure 300 of the high-frequency device in FIG. 4A.

FIG. 6A to FIG. 6J illustrates the process flow of manufacturing the structure 300 of the high-frequency device in FIG. 4A.

The present invention disclose a method for manufacturing the structure 300 of the high-frequency device, wherein the method mainly includes via-drilling and via-filling in the substrate, and lithography process on the substrate.

Figure 6A:
FIG. 6A to FIG. 6J illustrates the process flow of manufacturing the structure 300 of the high-frequency device in FIG. 4A in detail.
Figure 6B:
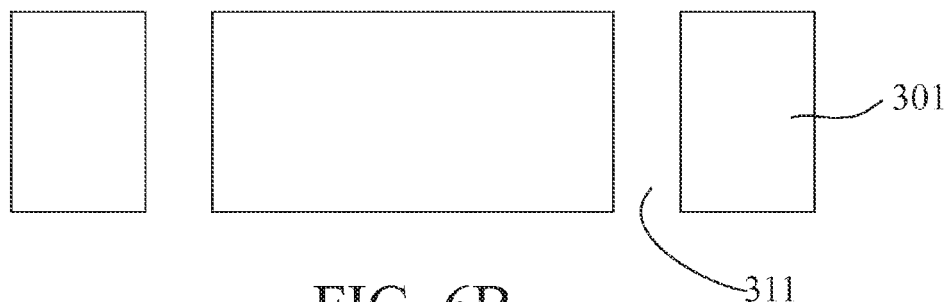
Figure 6C:
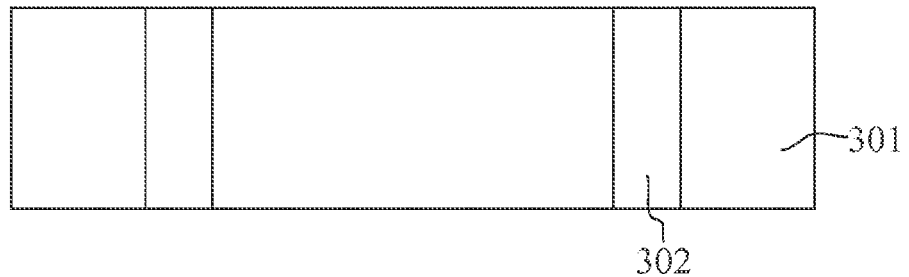

FIG. 6A to FIG. 6C describes the step 501 "form a through-hole via inductor 302 in the substrate 301" in FIG. 5C in detail.

As illustrated in FIG. 6A, provide a substrate 301. The substrate 301 has a top surface and a bottom surface. The substrate 301 can be made of any suitable material, such as a dielectric substrate or a ceramic substrate (e.g. aluminum-oxide ($Al_2O_3$) substrate). Before forming a through-hole via 311 in the substrate 301, the substrate 301 can be sintered. The thickness of the substrate 301 is 100~500 μm, preferably about 320 μm.

As illustrated in FIG. 6B, form a through-hole via 311 in the substrate 301. The through-hole via 311 can be formed by known techniques, such as drilling, mechanical through-hole or laser through-hole.

As illustrated in FIG. 6C, fill the through-hole via 311 with a conductive material to form a through-hole via inductor 302. The through-hole via inductor 302 can be made of any suitable material, such as Cu, Ag or a combination thereof, to reduce its resistance. Preferably, the height of the through-hole via inductor 302 is about 320 μm and the width in diameter of the through-hole via inductor 302 is about 100 μm.

The through-hole via inductor 302 can comprise at least two materials which are well designed in the through-hole via inductor 302 to achieve the better electrical characteristics, wherein one of said at least two materials is a conductive material. In one embodiment, the through-hole via inductor 302 can be made of at least two conductive materials. Please refer back to FIG. 2C and FIG. 2D, the through-hole via inductor 302 can be made of a first conductive material overlaying the sidewall of the through-hole via and a second conductive material enclosed by the first conductive material. The first conductive material can overlay the sidewall of the through-hole via by electroplating or any suitable coating process. Preferably, the first conductive material can be made of Cu and the second conductive material can be made of Ag. In another embodiment, the through-hole via inductor 302 can comprise a conductive material and a non-conductive material enclosed by the conductive material (refer back to FIG. 2E and FIG. 2F). Accordingly, it can greatly improve the electrical performance of the high-frequency device.

Figure 6D:
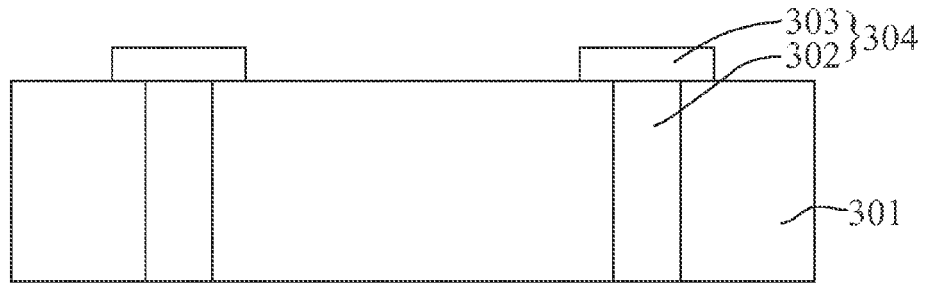

FIG. 6D describes the step 502 "form a horizontal inductor 303 on the top surface of the substrate 301" in FIG. 5C in detail.

As illustrated in FIG. 6D, form a first patterned conductive layer 303 on the top surface of the substrate 301 to form a horizontal inductor 303. The horizontal inductor 303 is electrically connected to the through-hole via inductor 302. The first patterned conductive layer 303 can be patterned by lithography process or printing process. The first patterned conductive layer 303 can be made of any suitable material, such as Cu, Ag or a combination thereof, to reduce its resistance. In one embodiment, the step 501 and step 502 can be combined in a single step "form an inductor 304 in the substrate 301" or "form a U-shape through-hole via inductor 250 in the substrate 301".

Figure 6E:
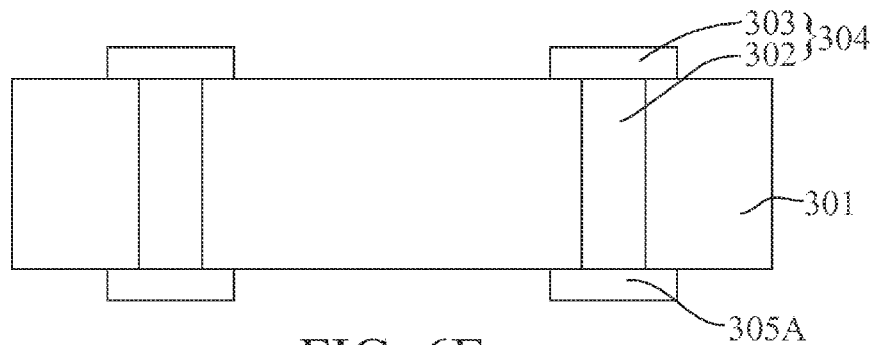
Figure 6F:
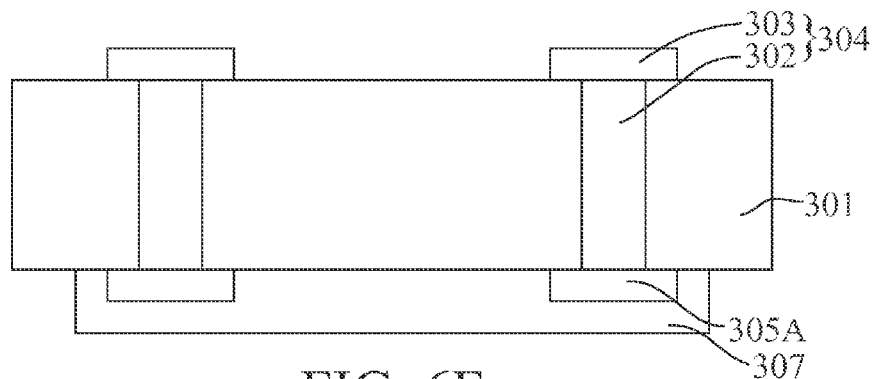
Figure 6G:
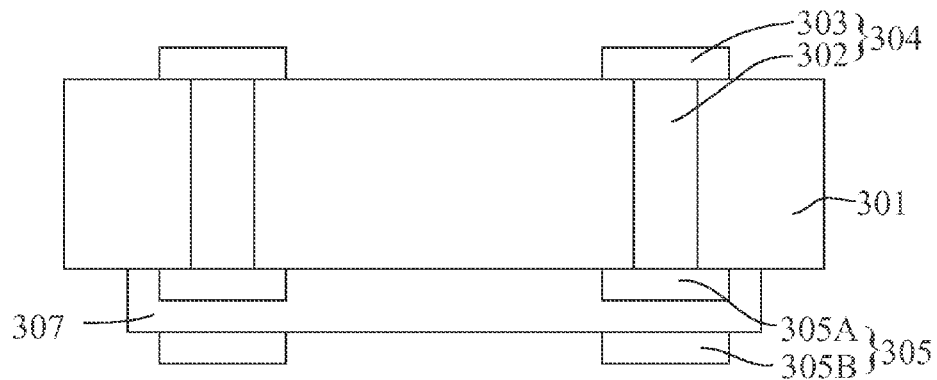

FIG. 6E to FIG. 6G describes the step 503 "form a horizontal capacitor 305 on the bottom surface of the substrate 301" in FIG. 5C in detail.

As illustrated in FIG. 6E, form a second patterned conductive layer 305A on the bottom surface of the substrate 301. The second patterned conductive layer 305A can be patterned by lithography process or printing process. The second patterned conductive layer 305A can be made of any suitable material, such as Cu, Ag or a combination thereof.

As illustrated in FIG. 6F, form a dielectric layer 307 to overlay the second patterned conductive layer 305A. The dielectric layer 307 can be formed by chemical vapor deposition (CVD). The dielectric layer 307 can be made of any suitable material with high dielectric constant and high-quality factor.

As illustrated in FIG. 6G, form a third patterned conductive layer 305B on the dielectric layer 307 to form a horizontal capacitor 305 on the bottom surface of the substrate 301. The second patterned conductive layer 305A is used as one electrode of the horizontal capacitor 305; the third patterned conductive layer 305B is used as the other electrode of the horizontal capacitor 305. The dielectric layer 307 is between two electrodes of the horizontal capacitor 305. The third patterned conductive layer 305B can be patterned by lithography process or printing process. The third patterned conductive layer 305B can be made of any suitable material, such as Cu, Ag or a combination thereof.

Figure 6H:
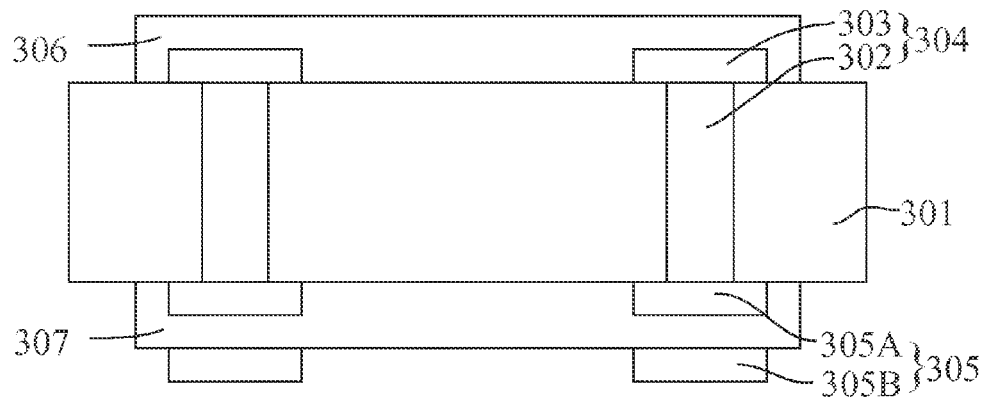

As illustrated in FIG. 6H, form a first passivation layer 306 to overlay the horizontal inductor 303. The first passivation layer 306 protects the horizontal inductor 303 from external interference.

Figure 6I:
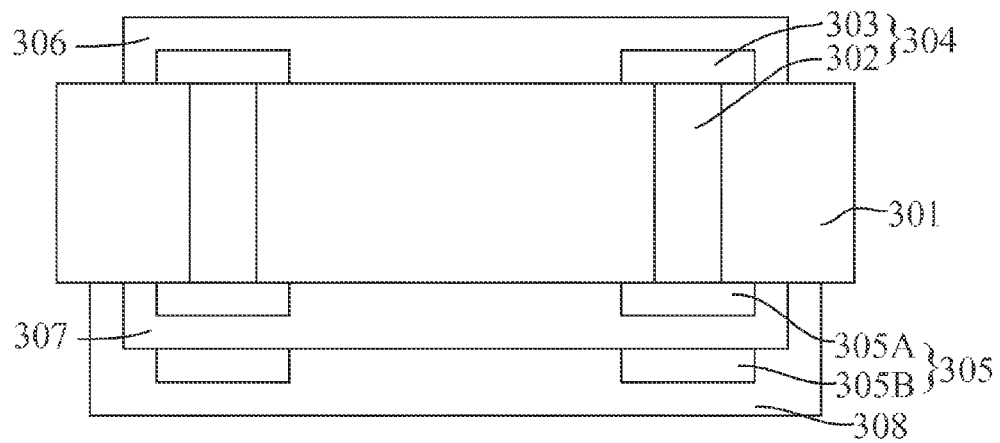

As illustrated in FIG. 6I, form a second passivation layer 308 to overlay the horizontal capacitor 305. The second passivation layer 308 protects the horizontal capacitor 305 from external interference.

Figure 6J:
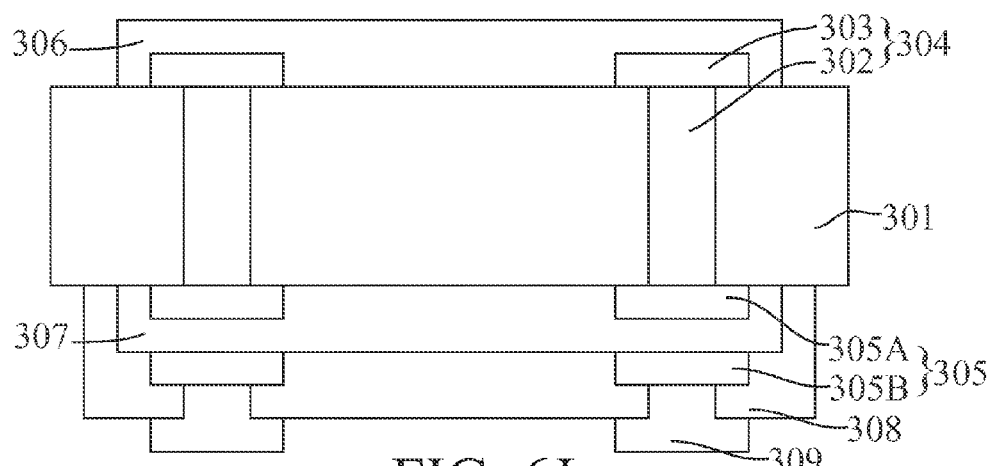

As illustrated in FIG. 6J, form a contact pad 309 on the second passivation layer 308 to electrically connect the horizontal capacitor 305. The contact pad 309 can be formed by lithography process or printing process.

Embodiment 2 discloses another method of manufacturing the structure 300 of the high-frequency device in FIG. 4A.

Please refer back to FIG. 5C. The present invention discloses another method for manufacturing the structure 300 of the high-frequency device, wherein the method mainly includes a multi-sheet substrate and lithography process on the multi-sheet substrate.

The method comprises three main steps: form a vertical inductor 302 in the substrate 301 (step 501); form a horizontal inductor 303 on the top surface of the substrate 301 (step 502); and form a horizontal capacitor 305 on the bottom surface of the substrate 301 (step 503). The order of step 502 and step 503 can be changed. In one embodiment, the step 501 and step 502 can be combined in a single step "forms an inductor 304 in the substrate 301" or "form a U-shape through-hole via inductor 250 in the substrate 301".

In step 501, form a vertical inductor 302 in the substrate 301. A sheet is formed by green of the ceramic material or green of the polymer material. The ceramic material or the polymer material can have a thickness of about 50~500 µm. Then, form a through-via in the sheet by known techniques, such as drilling, mechanical through-hole or laser through-hole, and fill the through-via in the sheet with a conductive material. So a sheet with of thickness of 150~400 µm is formed. A plurality of sheets can be stacked to form a substrate 301 by known process, such as LTCC (low-temperature co-fired ceramics). Then, perform sintering or curing to form a vertical inductor 302 in the substrate 301.

In step 502, form a horizontal inductor 303 on the top surface of the substrate 301. The horizontal inductor 303 can be formed by lithography process or printing process.

In step 503, form a horizontal capacitor 305 on the bottom surface of the substrate 301. The horizontal capacitor 305 is made by the combination of the electrodes and the dielectric layer which has a high dielectric constant and high-quality green. The green can be the mixture of the microwave-dielectric ceramic powders and an organic carrier. The organic carrier can be thermoplastic polymer, thermosetting polymer, plasticizer and organic solvent etc.

The steps of forming the green comprises mixing the microwave-dielectric ceramic powder with the organic vehicle and adjusting the mixture until the mixture has a suitable viscosity, degas, remove bubble, and tape casting. The green is adhered on the substrate 301 having the vertical inductor by pressing. After curing, form a horizontal capacitor 305 on the bottom surface of the substrate 301.

The steps or characteristics of FIG. 6H to FIG. 6J described in embodiment 1 can be applied to the embodiment 2 as well; therefore the details are not described herein.

Figure 7A:
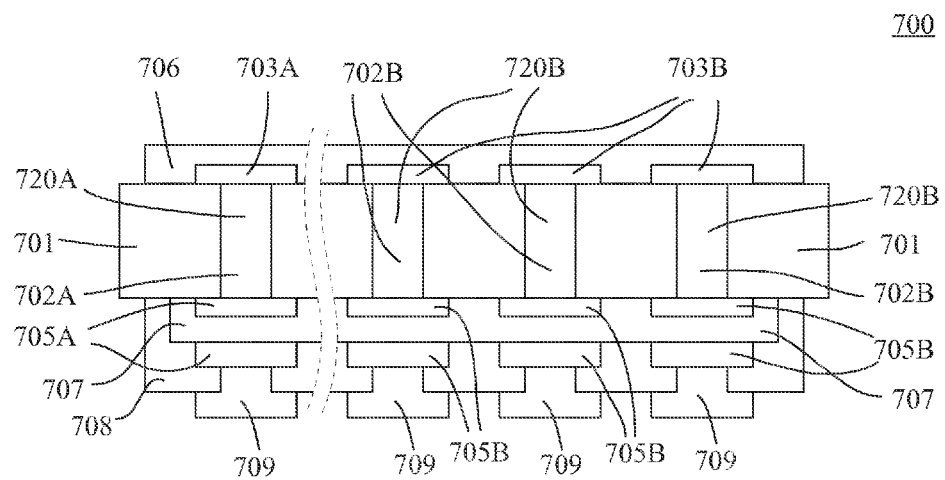
FIG. 7A illustrates a schematic cross-sectional view of the diplexer in the present invention.

Additionally, in one embodiment of the present invention, a diplexer is formed by combining a first filter and a second filter to optimize the performance of the diplexer. FIG. 7A illustrates a schematic cross-sectional view of the diplexer 700 in the present invention. The first filter 720A and the second filter 720B are disposed in the same substrate 701. The substrate 701 can be made of any suitable material, such as a dielectric substrate or a ceramic substrate (e.g. aluminum-oxide ($Al_2O_3$) substrate). The first filter 720A comprises a first through-hole via inductor 702A substantially disposed in the first through-hole of the substrate 701, and the second filter 720B comprises a second through-hole via inductor 702B substantially disposed in the second through-hole of the substrate 701. Optionally, the first filter 720A comprises a plurality of first through-hole via inductors 702A substantially disposed in the first through-hole of the substrate 701, or the second filter 720B comprises a plurality of second through-hole via inductors 702B substantially disposed in the second through-hole of the substrate 701. In one embodiment, each of the first through-hole via inductor 702A and the second through-hole via inductor 702B includes at least two materials which are well designed to achieve the above electrical characteristics, wherein one of said at least two materials is a conductive material, such as Cu, Ag or a combination thereof (see FIG. 2E and FIG. 2F). The through-hole via inductor has been described in the structure in FIG. 2A to FIG. 2F. The first through-hole via inductor 702A and the second through-hole via inductor 702B can be formed in the substrate 701 at the same time by any suitable process, such as via-drilling, via-filling in the substrate or lithography process.

Figure 7B:
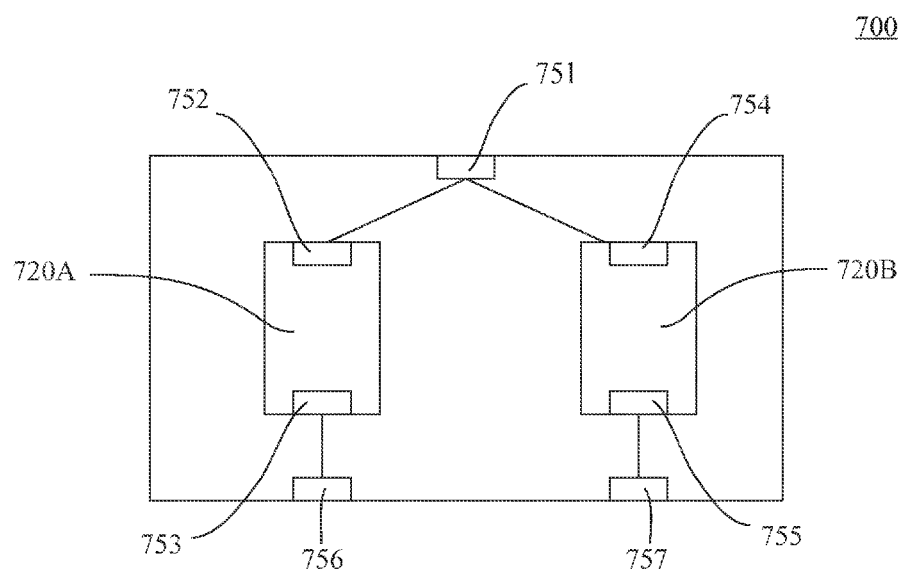
FIG. 7B illustrates a schematic diagram of the first filter and the second filter disposed in the diplexer.

FIG. 7B illustrates a schematic diagram of the first filter 720A and the second filter 720B disposed in the diplexer 700. The diplexer 700 has an input terminal 751 to receive an input signal. The first filter 720A has a first terminal 752 electrically connected to the input terminal 751 and a second terminal 753 to generate a first output signal; the second filter 720B has a third terminal 754 electrically connected to the input terminal 751 and a fourth terminal 755 to generate a second output signal.

The diplexer 700 has a first output terminal 756 electrically connected to the second terminal 753 of the first filter 720A to output the first output signal and a second output terminal 757 electrically connected to the fourth terminal 755 of the second filter 720B to output the second output signal. In one embodiment, the first filter 720A can be a high-pass filter and the second filter 720B is can be low-pass filter. Preferably, the cut-in frequency of the first filter 720A is substantially 4 GHz and the cut-off frequency of the second filter 720B is substantially 3 GHz. In one embodiment, the input signal comprises a first frequency and a second frequency less than the first frequency; the first output signal comprises a first frequency, and the second output signal comprises a second frequency. Preferably, the first frequency is substantially 5.0 GHz and the second frequency is substantially 2.4 GHz.

More specifically, please refer again to FIG. 7A, the first filter 720A comprises a first through-hole via inductor 702A substantially disposed in the first through-hole of the substrate 701. One terminal of the first through-hole via inductor 702A is electrically connected to a first horizontal inductor 703A disposed on the top surface of the substrate 701, and the other terminal of the first through-hole via inductor 702A is electrically connected to a first horizontal capacitor 705A disposed on the bottom surface of the substrate 701; the second filter 720B comprises a second through-hole via inductor 702B substantially disposed in the second through-hole of the substrate 701. One terminal of the second through-hole via inductor 702B is electrically connected to a second horizontal inductor 703B disposed on the top surface of the substrate 701, and the other terminal of the second through-hole via inductor 702B is electrically connected to a second horizontal capacitor 705B disposed on the bottom surface of the substrate 701.

The inductance of the first through-hole via inductor 702A is greater than that of the first horizontal inductor 703A, and the inductance of the second through-hole via inductor 702B is greater than that of the second horizontal inductor 703B. In one embodiment, the resultant inductance of the first through-hole via inductor 702A and the first horizontal inductor 703A is substantially equal to the inductance of the first through-hole via inductor 702A, and the resultant inductance of the second through-hole via inductor 702B and the second first horizontal inductor 703B is substantially equal to the inductance of the second through-hole via inductor 702B. In one embodiment, a parasitic capacitance in the interior of the diplexer 700 can be used as the first horizontal capacitor 705A or the second horizontal capacitor 705B so that the process cost is reduced. A dielectric layer 707 is disposed between two electrodes of the first horizontal capacitor 705A and between two electrodes of the second horizontal capacitor 705B. The first passivation layer 706 overlays the first horizontal inductor 703A and the second horizontal inductor 703B, and the second passivation layer 708 overlays the first horizontal capacitor 705A and the second horizontal capacitor 705B. A plurality of contact pads 709 are disposed on the first horizontal capacitor 705A and the second horizontal capacitor 705B.

Figure 7C:
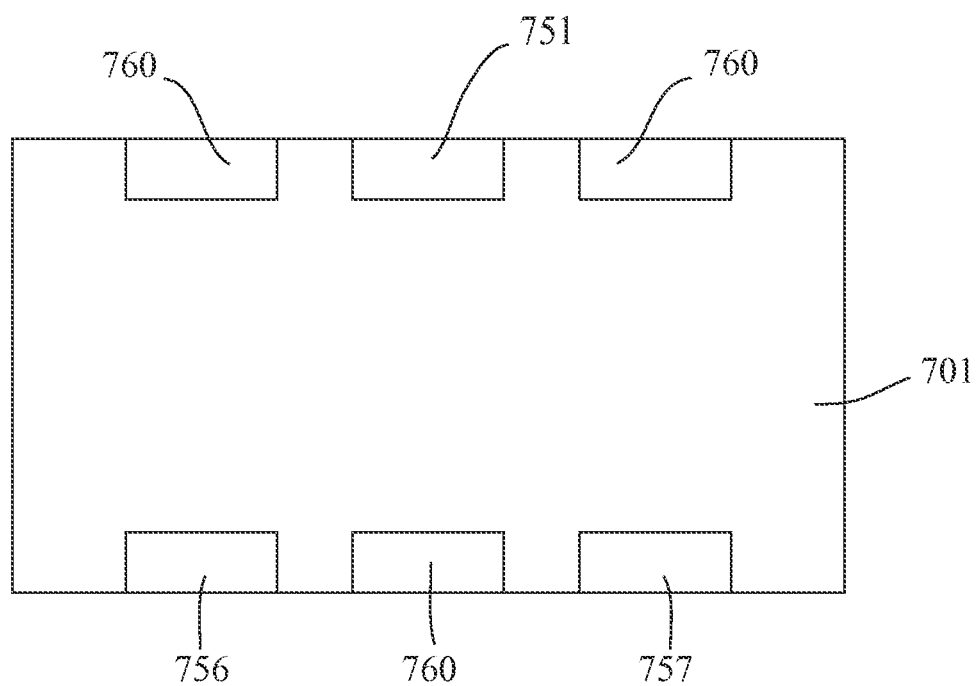
FIG. 7C illustrates a bottom view of the diplexer in the present invention.

Each of the first filter 720A and the second filter 720B can comprise at least one U-shape through-hole via inductor. The U-shape through-hole via inductor has been described in the structure in FIG. 3A to FIG. 3C such that it doesn't be repeated herein. In a preferred embodiment, each of the first filter 720A and the second filter 720B has a capacitor and a portion of an inductor disposed on opposite surfaces of the substrate 701, wherein each of the first filter 720A and the second filter 720B comprises at least one U-shape through-hole via inductor which are all connected to a single capacitor disposed on the bottom surface of the substrate 701. FIG. 7C illustrates a bottom view of the diplexer 700 in the present invention. The input terminal 751, the first output terminal 756, the second output terminal 757 and three ground terminals 760 can be disposed on the bottom surface of the substrate 701. However, the present invention is not limited to this arrangement.

FIG. 8A to FIG. 8J illustrates the process flow of manufacturing the diplexer 700 in FIG. 7A.

Figure 8A:
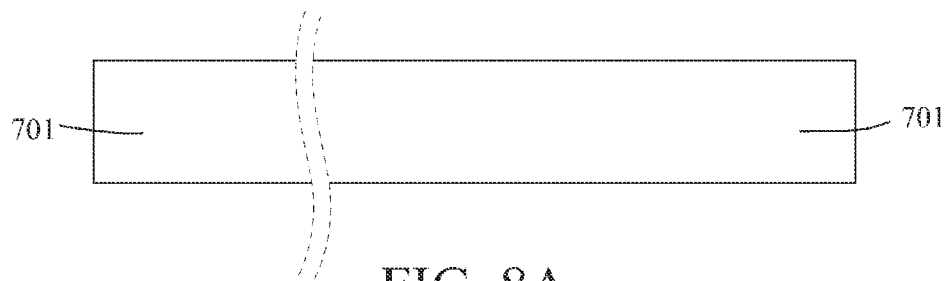
FIG. 8A to FIG. 8J illustrates the process flow of manufacturing the diplexer in FIG. 7A in detail.
Figure 8B:
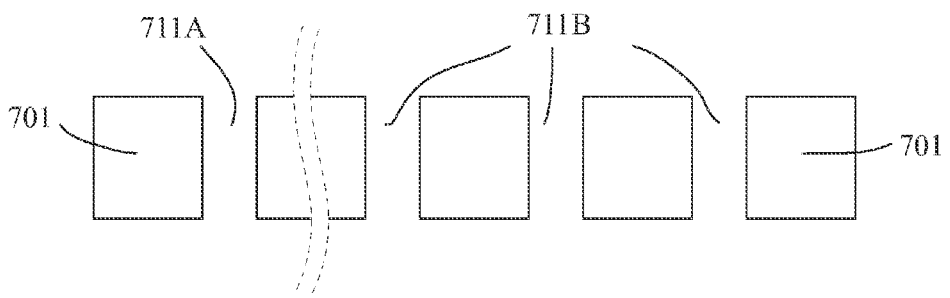
Figure 8C:
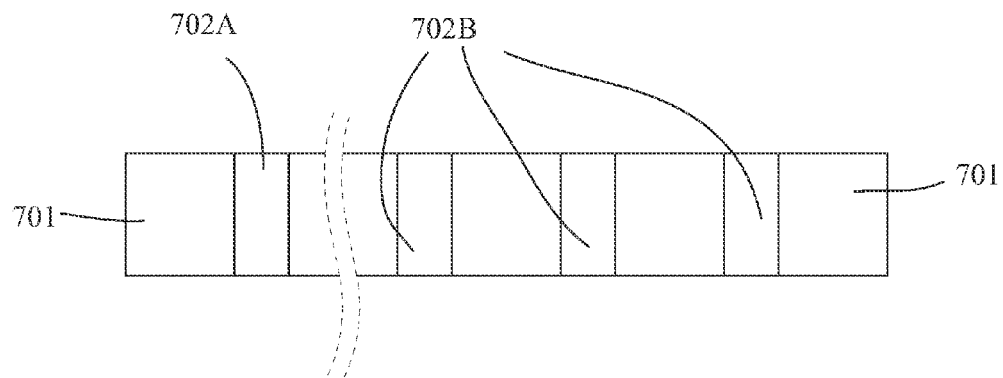

FIG. 8A to FIG. 8C describes the step 501 "form a through-hole via inductor in the substrate" in FIG. 5C in detail.

As illustrated in FIG. 8A, provide a substrate 701. The substrate 701 has a top surface and a bottom surface. The substrate 701 can be made of any suitable material, such as a dielectric substrate or a ceramic substrate (e.g. aluminum-oxide ($Al_2O_3$) substrate). Before forming at least one through-hole via 711A, 711B in the substrate 701, the substrate 701 can be sintered. The thickness of the substrate 701 is 100~500 μm, preferably about 320 μm.

As illustrated in FIG. 8B, form a first through-hole via 711A and a second through-hole via 711B in the substrate 701. The first through-hole via 711A and the second through-hole via 711B can be formed by known techniques, such as drilling, mechanical through-hole or laser through-hole.

As illustrated in FIG. 8C, fill the first through-hole via 711A and the second through-hole via 711B with a conductive material to form a first through-hole via inductor 702A and a second through-hole via inductor 702B. The first through-hole via inductor 702A and the second through-hole via inductor 702B can be made of any suitable material, such as Cu, Ag or a combination thereof, to reduce its resistance. Preferably, the height of each of the first through-hole via inductor 702A and the second through-hole via inductor 702B is about 320 μm, and the width in diameter of each of the first through-hole via inductor 702A and the second through-hole via inductor 702B is about 100 μm.

Each of the first through-hole via inductor 702A and the second through-hole via inductor 702B can comprise at least two materials which are well designed to achieve the better electrical characteristics, wherein one of said at least two materials is a conductive material. In one embodiment, each of the first through-hole via inductor 702A and the second through-hole via inductor 702B can be made of at least two conductive materials. Please refer back to FIG. 2C and FIG. 2D, the through-hole via inductor 102 can be made of a first conductive material overlaying the sidewall of the through-hole via and a second conductive material enclosed by the first conductive material. The first conductive material can overlay the sidewall of the through-hole via by electroplating or any suitable coating process. Preferably, the first conductive material can be made of Cu, and the second conductive material can be made of Ag. In another embodiment, each of the first through-hole via inductor 702A and the second through-hole via inductor 702B can comprise a conductive material and a non-conductive material enclosed by the conductive material (refer back to FIG. 2E and FIG. 2F). Accordingly, it can greatly improve the electrical performance of the diplexer.

Figure 8D:
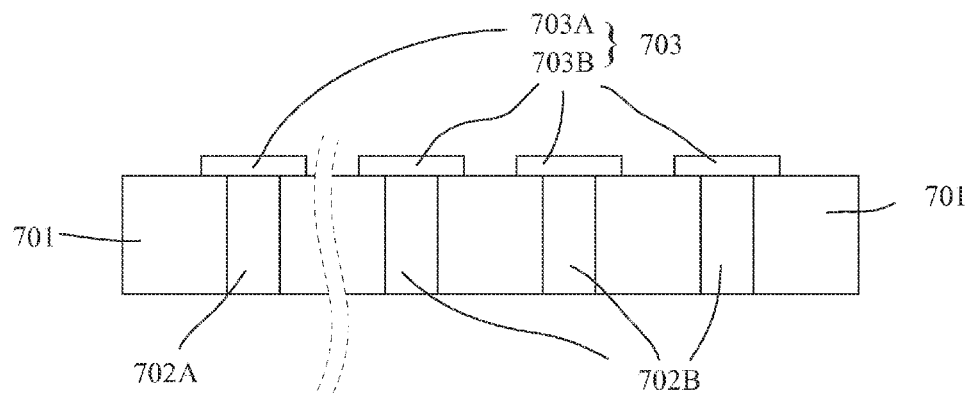

FIG. 8D describes the step 502 "form a horizontal inductor on the top surface of the substrate" in FIG. 5C in detail.

As illustrated in FIG. 8D, form a first patterned conductive layer 703 on the top surface of the substrate 701 to form a first horizontal inductor 703A and a second horizontal inductor 703B. The first horizontal inductor 703A is electrically connected to the first through-hole via inductor 702A, and the second horizontal inductor 703B is electrically connected to the second through-hole via inductor 702B. The first patterned conductive layer 703 can be patterned by lithography process or printing process. The first patterned conductive layer 703 can be made of any suitable material, such as Cu, Ag or a combination thereof, to reduce its resistance. In one embodiment, the step 501 and step 502 can be combined in a single step "form an inductor 304 in the substrate 301" or "form a U-shape inductor 250 in the substrate 301".

Figure 8E:
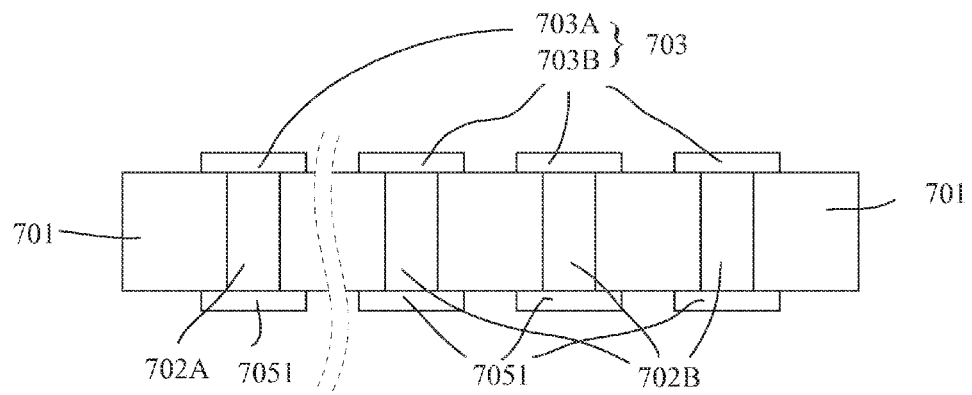
Figure 8F:
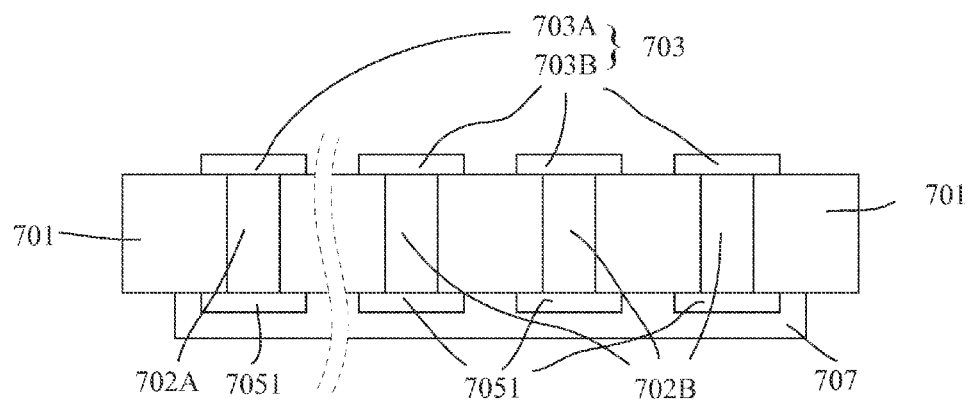
Figure 8G:
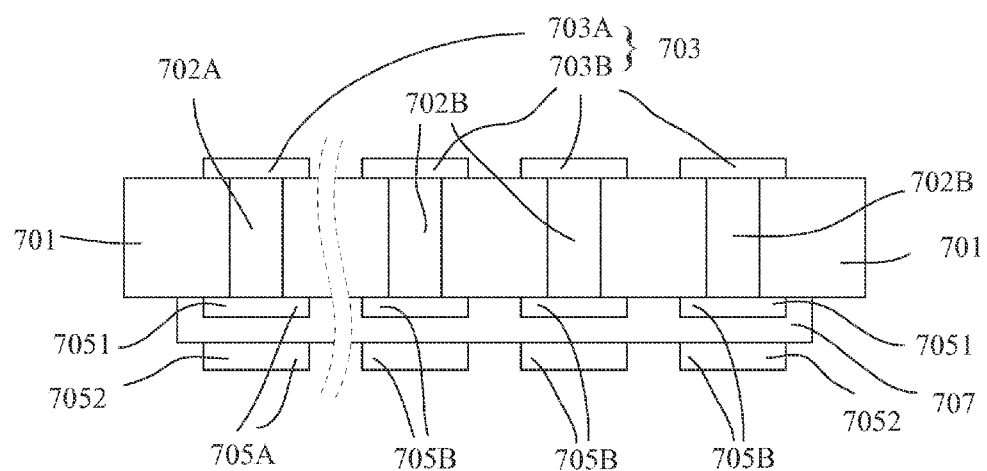

FIG. 8E to FIG. 8G describes the step 503 "form a horizontal capacitor on the bottom surface of the substrate" in FIG. 5C in detail.

As illustrated in FIG. 8E, form a second patterned conductive layer 7051 on the bottom surface of the substrate 701. The second patterned conductive layer 7051 can be patterned by lithography process or printing process. The second patterned conductive layer 7051 can be made of any suitable material, such as Cu, Ag or a combination thereof.

As illustrated in FIG. 8F, form a dielectric layer 707 to overlay the second patterned conductive layer 7051. The dielectric layer 707 can be formed by chemical vapor deposition (CVD). The dielectric layer 707 can be made of any suitable material with high dielectric constant and high-quality factor.

As illustrated in FIG. 8G, form a third patterned conductive layer 7052 on the dielectric layer 307 to form a first horizontal capacitor 705A and a second horizontal capacitor 705B on the bottom surface of the substrate 701. The second patterned conductive layer 7051 is used as one electrode of each of the first horizontal capacitor 305A and the second horizontal capacitor 305B; the third patterned conductive layer 7052 is used as the other electrode of each of the first horizontal capacitor 305A and the second horizontal capacitor 305B. The dielectric layer 707 is between two electrodes of each of the first horizontal capacitor 705A and the second horizontal capacitor 705B. The third patterned conductive layer 7052 can be patterned by lithography process or printing process. The third patterned conductive layer 7052 can be made of any suitable material, such as Cu, Ag or a combination thereof.

Figure 8H:
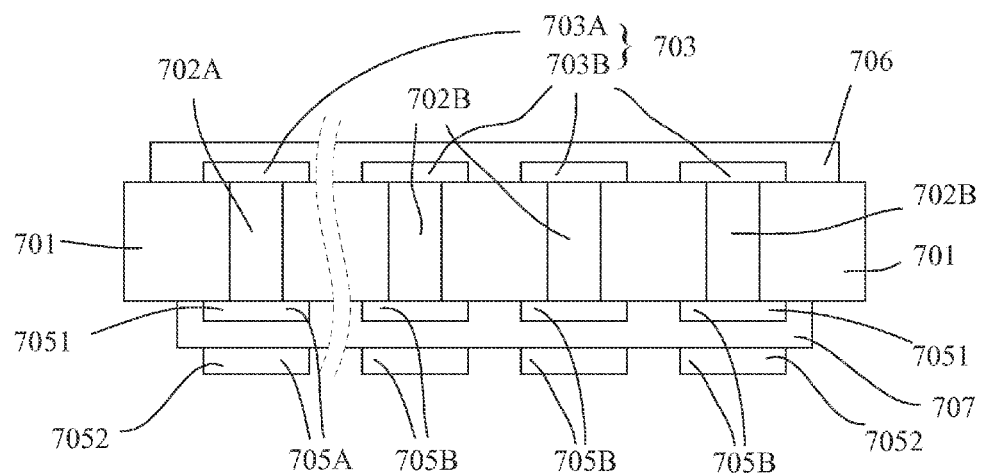

As illustrated in FIG. 8H, form a first passivation layer 706 to overlay the first horizontal inductor 703A and the second horizontal inductor 703B. The first passivation layer 706 protects the first horizontal inductor 703A and the second horizontal inductor 703B from external interference.

Figure 8I:
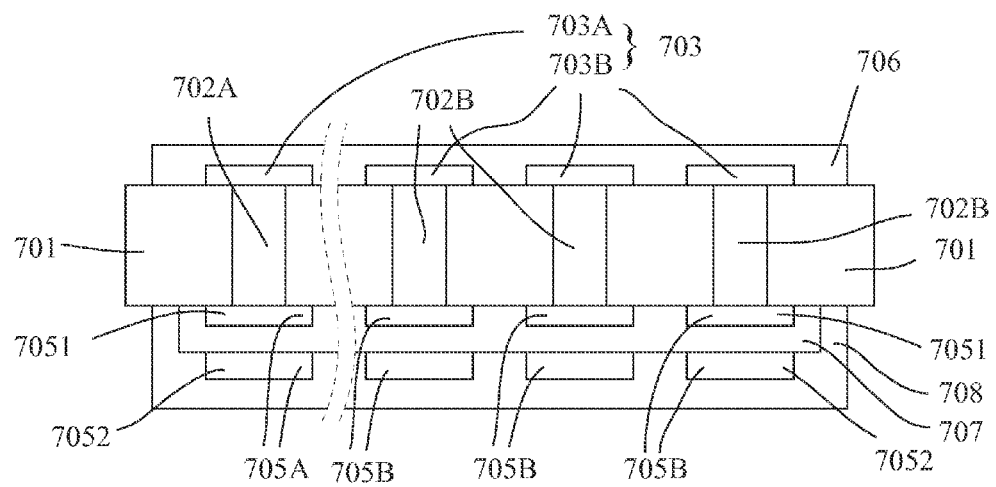

As illustrated in FIG. 8I, form a second passivation layer 708 to overlay the first horizontal capacitor 705A and the second horizontal capacitor 705B. The second passivation layer 708 protects the first horizontal capacitor 705A and the second horizontal capacitor 705B from external interference.

Figure 8J:
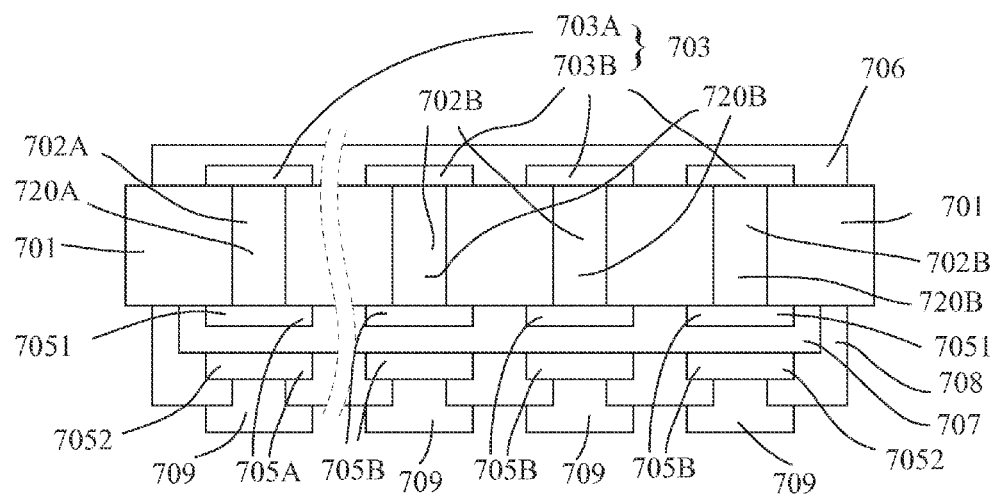

As illustrated in FIG. 8J, form a plurality of contact pads 309 on the second passivation layer 708 to electrically connect the first horizontal capacitor 705A and the second horizontal capacitor 705B. The contact pads 709 can be formed by lithography process or printing process.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A diplexer, comprising:
a substrate;
an input terminal to receive an input signal;
a first filter having a first terminal electrically connected to the input terminal and a second terminal to generate a first output signal, wherein the first filter comprises a first through-hole via inductor substantially disposed in the substrate; and
a second filter having a third terminal electrically connected to the input terminal and a fourth terminal to generate a second output signal, wherein the second filter comprises a second through-hole via inductor substantially disposed in the substrate;
wherein the first filter further comprises a first horizontal inductor disposed on a first surface of the substrate, and the first horizontal inductor is electrically connected to the first through-hole via inductor, wherein an inductance of the first through-hole via inductor is greater than that of the first horizontal inductor.

2. The diplexer according to claim 1, further comprising:
a first output terminal electrically connected to the second terminal of the first filter to output the first output signal; and
a second output terminal electrically connected to the fourth terminal of the second filter to output the second output signal.

3. The diplexer according to claim 1, wherein the first filter is a high-pass filter and the second filter is a low-pass filter.

4. The diplexer according to claim 3, wherein the cut-in frequency of the first filter is substantially 4 GHz and the cut-off frequency of the second filter is substantially 3 GHz.

5. The diplexer according to claim 2, wherein the input signal comprises a first frequency and a second frequency smaller than the first frequency; the first output signal comprises a first frequency, and the second output signal comprises a second frequency.

6. The diplexer according to claim 5, wherein the first frequency is substantially 5.0 GHz and the second frequency is substantially 2.4 GHz.

7. The diplexer according to claim 1, wherein the second filter further comprises a second horizontal inductor disposed on the first surface of the substrate, the second horizontal inductor is electrically connected to the second through-hole via inductor, wherein an inductance of the second through-hole via inductor is greater than that of the second horizontal inductor.

8. The diplexer according to claim 7, wherein the resultant inductance of the first through-hole via inductor and the first horizontal inductor is substantially equal to the inductance of the first through-hole via inductor; the resultant inductance of the second through-hole via inductor and the second horizontal inductor is substantially equal to the inductance of the second through-hole via inductor.

9. The diplexer according to claim 1, wherein each of the first through-hole via inductor and the second through-hole via inductor comprises at least two materials, wherein one of said at least two materials is a conductive material.

10. The diplexer according to claim 1, wherein each of the first through-hole via inductor and the second through-hole via inductor comprises: a first conductive material overlaying the sidewall of the through-hole via of said each of the first through-hole via inductor and the second through-hole via inductor; and a second conductive material enclosed by the first conductive material.

11. The diplexer according to claim 1, wherein each of the first through-hole via inductor and the second through-hole via inductor comprises a conductive material and a non-conductive material enclosed by the conductive material.

12. The diplexer according to claim 1, wherein the substrate is a ceramic substrate.

13. The diplexer according to claim 1, wherein the first filter further comprises:
a third through-hole via inductor substantially disposed in the substrate, wherein the first horizontal inductor comprises a first end and a second end, wherein the first end is electrically connected to the first through-hole via inductor and the second end is electrically connected to the third through-hole via inductor; and
wherein the second filter further comprises:
a fourth through-hole via inductor substantially disposed in the substrate; and
a second horizontal inductor disposed on the top surface of the substrate, wherein the second horizontal inductor comprises a third end and a fourth end, wherein the third end is electrically connected to the second through-hole via inductor and the fourth end is electrically connected to the fourth through-hole via inductor.

14. The diplexer according to claim 13, wherein the resultant inductance of the first through-hole via inductor and the third through-hole via inductor is greater than an inductance of the first horizontal inductor, and a resultant inductance of the second through-hole via inductor and the fourth through-hole via inductor is greater than the inductance of the second horizontal inductor.

15. The diplexer according to claim 13, wherein each of the first through-hole via inductor, the second through-hole via inductor, the third through-hole via inductor and the fourth through-hole via inductor comprises:
a first conductive material overlaying the sidewall of the through-hole via of said each of the first through-hole inductor, the second through-hole inductor, the third through-hole via inductor and the fourth through-hole via inductor; and
a second conductive material enclosed by the first conductive material.

16. The diplexer according to claim 13, wherein each of the first through-hole via inductor, the second through-hole via inductor, the third through-hole via inductor and the fourth through-hole via inductor comprises a conductive material and a non-conductive material enclosed by the conductive material.

17. The diplexer according to claim 13, wherein the first filter further comprises a first horizontal capacitor on a second surface of the substrate, wherein at least one of the first through-hole via inductor and the third through-hole via inductor is electrically connected to the first horizontal capacitor; and the second filter further comprises a second horizontal capacitor on the second surface of the substrate, wherein at least one of the second through-hole via inductor and the fourth through-hole via inductor is electrically connected to the second horizontal capacitor.

18. A diplexer, comprising:
a substrate;
an input terminal to receive an input signal;
a first filter has a first terminal electrically connected to the input terminal and a second terminal to generate a first output signal, wherein the first filter comprises a first U-shape through-hole via inductor, wherein the first U-shape through-hole via inductor comprises:
   a first through-hole via inductor substantially disposed in the first through-hole of the substrate;
   a second through-hole via inductor disposed in the second through-hole of the substrate; and
   a first horizontal inductor disposed on the top surface of the substrate,
      wherein the first horizontal inductor has a first end and a second end, wherein the first end is electrically connected to the first through-hole via inductor, and the second end is electrically connected to the second through-hole via inductor; and
a second filter has a third terminal electrically connected to the input terminal and a fourth terminal to generate a second output signal, wherein the second filter comprises a second U-shape through-hole via inductor, wherein the second U-shape through-hole via inductor comprises:
   a third through-hole via inductor disposed in the third through-hole of the substrate;
   a fourth through-hole via inductor disposed in the fourth through-hole of the substrate; and
   a second horizontal inductor disposed on the top surface of the substrate,
      wherein the second horizontal inductor has a third end and a fourth end, wherein the third end is electrically connected to the third through-hole via inductor, and the fourth end is electrically connected to the fourth through-hole via inductor.

19. The diplexer according to claim 18, wherein the resultant inductance of the first through-hole via inductor and the second through-hole via inductor is greater than that of the first horizontal inductor, and a resultant inductance of the third through-hole via inductor and the fourth through-hole via inductor is greater than that of the second horizontal inductor.

20. The diplexer according to claim 18, wherein the first filter further comprises a first horizontal capacitor on the second surface of the substrate, wherein at least one of the first through-hole via inductor and the second through-hole via inductor is electrically connected to the first horizontal capacitor; the second filter further comprises a second horizontal capacitor on the second surface of the substrate, wherein at least one of the third through-hole via inductor and the fourth through-hole via inductor is electrically connected to the second horizontal capacitor.

* * * * *